US005502000A

United States Patent [19]
Look et al.

[11] Patent Number: 5,502,000
[45] Date of Patent: Mar. 26, 1996

[54] METHOD OF FORMING A ANTIFUSE STRUCTURE WITH INCREASED BREAKDOWN AT EDGES

[75] Inventors: Kevin T. Look, Fremont; Evert A. Wolsheimer, Sunnyvale, both of Calif.

[73] Assignee: Xilinx, Inc., San Jose, Calif.

[21] Appl. No.: 436,995

[22] Filed: May 8, 1995

Related U.S. Application Data

[60] Division of Ser. No. 132,071, Oct. 4, 1993, Pat. No. 5,475,253, which is a continuation-in-part of Ser. No. 933,428, Aug. 21, 1992, abandoned.

[51] Int. Cl.$^6$ ............................. H01L 21/70; H01L 27/00
[52] U.S. Cl. .......................... 437/60; 437/922; 437/947; 148/DIG. 55
[58] Field of Search ......................... 437/947, 922, 437/60, 52; 257/530, 527, 50; 148/DIG. 55

[56] References Cited

U.S. PATENT DOCUMENTS

| | | | |
|---|---|---|---|
| 5,070,384 | 12/1991 | McCollum et al. | 357/51 |
| 5,166,556 | 11/1992 | Hsu et al. | 257/530 |
| 5,181,096 | 1/1993 | Forouhi | 257/530 |
| 5,242,851 | 9/1993 | Choi | 437/922 |
| 5,290,734 | 3/1994 | Boardman | 437/922 |

FOREIGN PATENT DOCUMENTS

| | | |
|---|---|---|
| 0416903A2 | 9/1990 | European Pat. Off. . |
| 0452091A2 | 4/1991 | European Pat. Off. . |
| 0483958A1 | 8/1991 | European Pat. Off. . |
| 0500034A1 | 2/1992 | European Pat. Off. . |
| WO92/16976 | 3/1992 | WIPO . |
| WO92/20095 | 4/1992 | WIPO . |

OTHER PUBLICATIONS

Kueing–Long Chen, et al., "A Sublithographic Antifuse Structure for Field–Programmable Gate Array Applications", IEEE Electron Device Letters, 13 (1992) Jan., pp. 53–55.

Cook, Brian; Keller, Steve; "Amorphous Silicon Antifuse Technology for Bipolar Proms", IEEE, 1986 Bipolar Circuits and Technology Meeting, pp. 99–100.

S. Chiang, R. Forouhi, W. Chen, F. Hawley, J. McCollum, E. Hamdy, and C. Hu, "Antifuse Structure Comparison for Field Programmable Gate Arrays", IEEE, pp. 24.6.1–24.6.4, Copyright 1992.

*Primary Examiner*—George Fourson
*Assistant Examiner*—H. Jey Tsai
*Attorney, Agent, or Firm*—Jeanette S. Harms

[57] ABSTRACT

An antifuse is provided which includes a first conductive layer, an antifuse layer formed on the first conductive layer, and a second conductive layer formed on the antifuse layer. A portion of the antifuse layer forms a substantially orthogonal angle with the first conductive layer and the second conductive layer. This "corner" formation of the antifuse enhances the electric field at this location during programming, thereby providing a predictable location for the filament, i.e. the conductive path between the first and second conductive layers. This antifuse provides other advantages including: a relatively low programming voltage, good step coverage for the antifuse layer and the upper conductive layer, a low, stable resistance value, and minimal shearing effects on the filament.

24 Claims, 7 Drawing Sheets

METHOD OF FORMING A ANTIFUSE STRUCTURE WITH INCREASED BREAKDOWN AT EDGES

CROSS REFERENCE TO RELATED APPLICATION

This application is a division of application Ser. No. 08/132,071, filed Oct. 4, 1993 now U.S. Pat. No. 5,475,253, which is a continuation-in-part of U.S. patent application Ser. No. 07/933,428, entitled "Antifuse Structure and Method for Forming", filed Aug. 21, 1992.

BACKGROUND OF THE INVENTION

1. Field of the Invention

This invention relates to antifuses, and in particular to an antifuse structure with an increased breakdown at the edges of an antifuse layer.

2. Description of the Related Art

Antifuses are well known in the art. An antifuse is a structure which is non-conductive when manufactured, but becomes permanently conductive by applying a predetermined voltage across its terminals. Antifuses are typically used in programmable logic devices to programmably interconnect conductive lines.

Figure 1A:
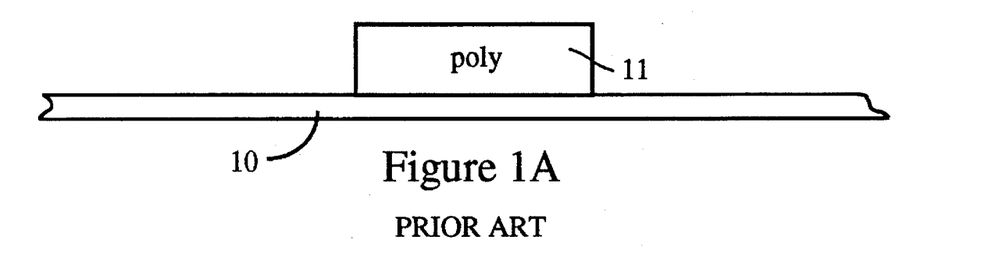
FIGS. 1A–1D illustrate one method of forming a conventional antifuse.
Figure 1B:
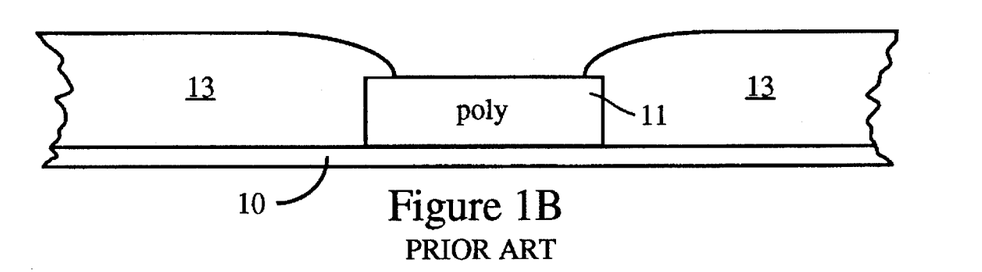
Figure 1C:
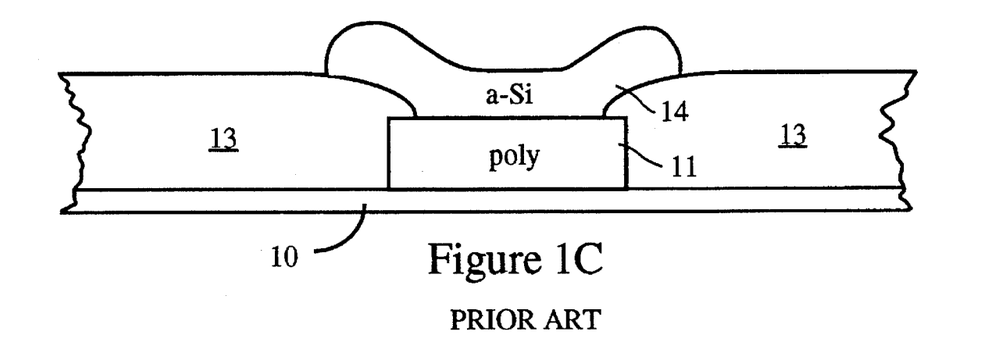
Figure 1D:
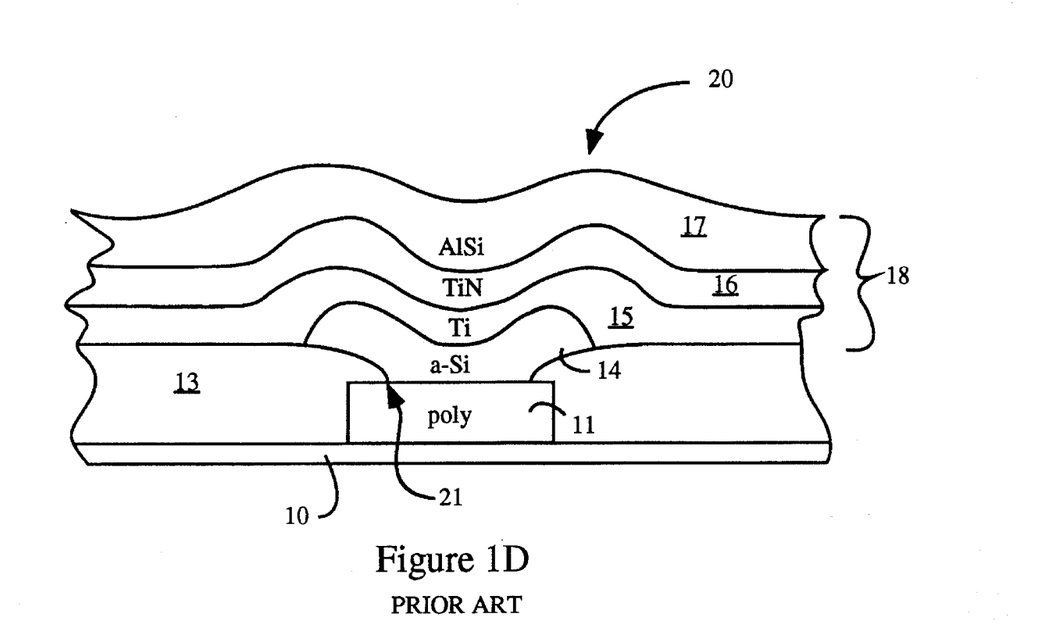

FIGS. 1A–1D illustrate a conventional method of forming an antifuse. Referring to FIG. 1A, a polycrystalline silicon layer 11 is formed on substrate 10 to provide a lower conductive terminal for the antifuse. An insulation layer 13 is then deposited and patterned to partially expose polycrystalline silicon layer 11 as shown in FIG. 1B. Referring to FIG. 1C, an amorphous silicon layer 14 is then deposited and patterned to cover the exposed portion of polycrystalline silicon layer 11 and portions of insulation layer 13 adjacent to polycrystalline silicon layer 11. Referring to FIG. 1D, conductive layers 18, including titanium layer 15, titanium nitride layer 16, and aluminum-silicon layer 17, are formed over amorphous silicon layer 14, and then patterned (not shown) to form an upper conductive terminal.

However, antifuse 20 requires a relatively high voltage, typically 12–14 volts, to program. Standard transistors used in 5-volt integrated circuit systems typically break down between 12–14 volts. Thus, special processing is needed to enhance the breakdown characteristic of the transistors for programming the antifuse. Moreover, to ensure proper operation of the integrated circuit system, other structures in the system must be isolated from the antifuse programming voltages.

Furthermore, antifuse 20 is undesirably affected by internal temperatures generated during programming. Specifically, during programming of antifuse 20, the leakage current of this device increases with the increase in applied voltage. Eventually, the leakage current focuses on a localized weak spot in amorphous silicon layer 14. A thermal runaway condition then develops which results in localized heating and, eventually, filament formation between the upper conductive terminal and the lower conductive terminal. The different thermal expansion coefficients of the materials in different layers of the antifuse structure in turn cause stresses to develop in the material as it cools after programming. Over time, these stresses will relax, producing movement between layers of the antifuse material.

Figure 2A:
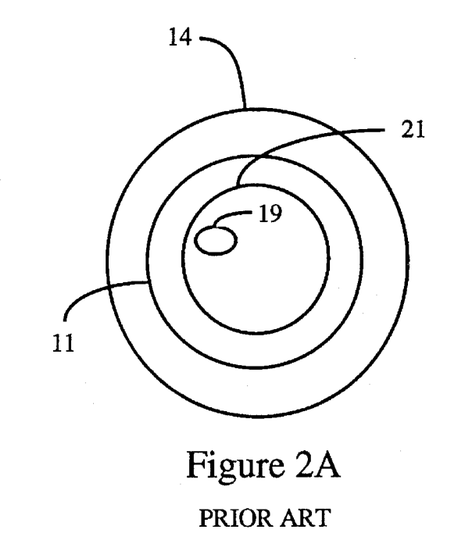
FIG. 2A shows a partial view of the conventional antifuse illustrated in FIG. 1D after programming.
Figure 2B:
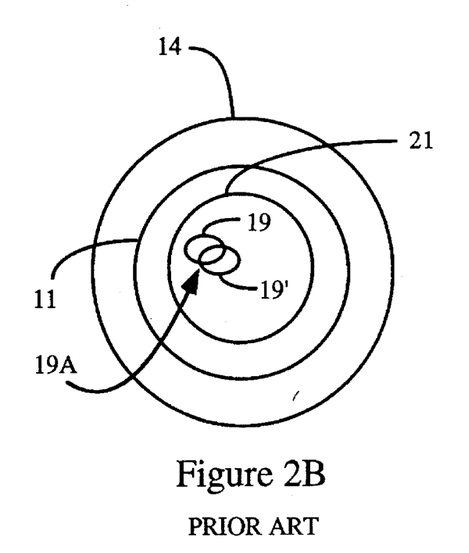
FIG. 2B shows a partial view of the conventional antifuse illustrated in FIG. 1D after shearing occurs.

FIG. 2A shows a partial top view of antifuse 20 after programming in which filament 19 joins titanium layer 15 (FIG. 1D) and polysilicon layer 11. Note that FIG. 2A illustrates an edge 21 of amorphous silicon layer 14 that contacts polycrystalline silicon layer 11. As described above, stress relaxation occurs within amorphous silicon layer 14, not at its boundaries. Therefore, referring to FIG. 2B, if shearing occurs in prior art antifuse 20 due to stress relaxation, the sheared portion 19' of filament 19 significantly reduces the surface area 19A for conducting current, thereby resulting in instability of the resistance provided by antifuse 20.

Therefore, a need arises for an antifuse which programs at a relatively low programming voltage and ensures a stable resistance irrespective of shearing conditions.

SUMMARY OF THE INVENTION

In accordance with the present invention, an antifuse comprises a first conductive layer, an antifuse layer formed on the first conductive layer, and a second conductive layer formed on the antifuse layer. A portion of the antifuse layer forms a substantially orthogonal angle with the first conductive layer and again with the second conductive layer. This "double corner" formation of the antifuse layer enhances the electric field during programming. Thus, the resulting filament, i.e. the conductive path between the first and second conductive layers formed during programming, consistently forms along this corner.

The present invention provides advantages under shearing conditions due to stress relaxation that typically occur within the programmed antifuse structure. Specifically, because a filament in accordance with the present invention is formed at one of the boundaries of the antifuse, not within the antifuse structure, the filament is substantially unaffected by shearing conditions caused by stress relaxation. Therefore, an antifuse in accordance with the present invention provides a stable resistance even under stress relaxation conditions.

Furthermore, in contrast to the prior art antifuses which have a programming voltage of 12–14 volts, an antifuse in accordance with the present invention has a programming voltage of 8–9 volts. Thus, ordinary transistors which break down at 12–14 volts can be used both for programming antifuses and for logic functions.

DETAILED DESCRIPTION OF THE DRAWINGS

Figure 3A:
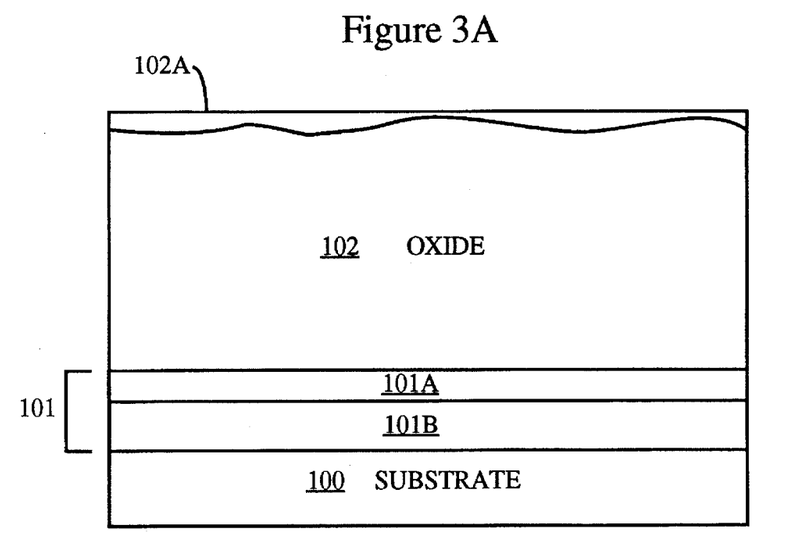
FIGS. 3A–3J illustrate one method of forming an antifuse in accordance with the present invention.

FIGS. 3A–3J illustrate the steps to provide one embodiment of an antifuse in accordance with the present invention. Referring to FIG. 3A, a conductive layer 101, approximately 4500Å to 7000Å thick, is formed on substrate 100. In this embodiment of the present invention, conductive layer 101 includes two layers, bottom layer 101A and top layer 101B. The bottom layer 101A is aluminum (Al) having a thickness of approximately 3500Å to 6500Å. The top layer 101B is titanium-tungsten (TiW) having a thickness of approximately 1000Å to 3000Å. Layer 101B is formed on top of layer 101A to prevent the diffusion of aluminum into a to-be-formed amorphous silicon layer (shown in FIG. 3H). In other embodiments, bottom layer 101A is aluminum-silicon (AlSi) or aluminum-silicon-copper (AlSiCu) and top layer 101B is titanium-nitride (TiN). In yet other embodiments of the present invention, conductive layer 101 is formed solely from titanium-tungsten (TiW). Conductive layer 101 forms the lower conductive terminal (hereinafter lower conductive terminal 101) of the to-be-formed antifuse.

After formation of this lower conductive terminal, a layer of undoped oxide, for example silicon dioxide, is deposited at a temperature of about 400° C. to a thickness of approximately 15,000Å. This oxide serves as a sacrificial oxide during the subsequent planarization process. Specifically, as shown in FIG. 3A, a photoresist layer 102A is deposited on layer 102. Then, an etch removes photoresist layer 102A and approximately 9,000Å to 11,000Å of oxide layer 102.

Figure 3B:
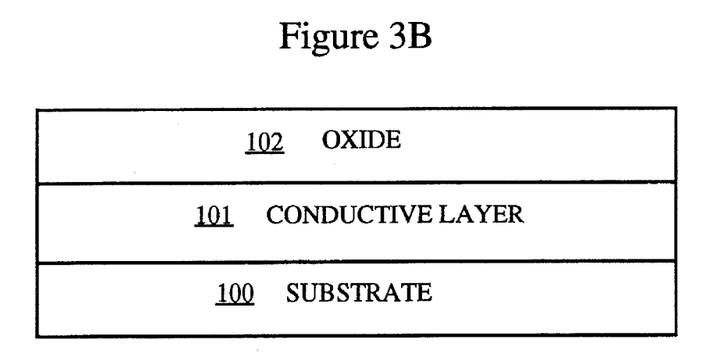

As is well known in the art, photoresist layer 102A forms a planar surface on the somewhat irregular surface of oxide layer 102. Etching of thinner portions of photoresist occurs more rapidly than thicker portions of photoresist. Thus, after removal of photoresist layer 102A and a portion of oxide layer 102, a substantially planar surface is provided on oxide layer 102 as shown in FIG. 3B.

Figure 3C:
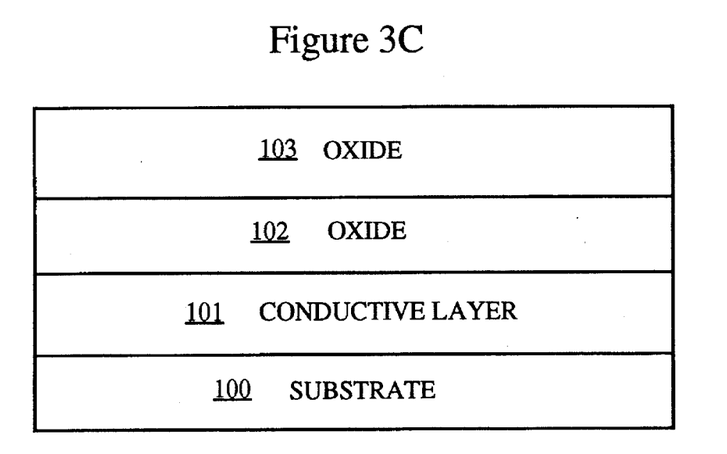

Referring to FIG. 3C, after the oxide etch, another oxide layer 103, approximately 8000Å thick, is deposited at a temperature of about 400° C. to a thickness between 9,000Å and 10,000Å on oxide layer 102 to ensure adequate isolation between lower conductive terminal 101 and the to-be-formed upper conductive terminal.

Figure 3D:
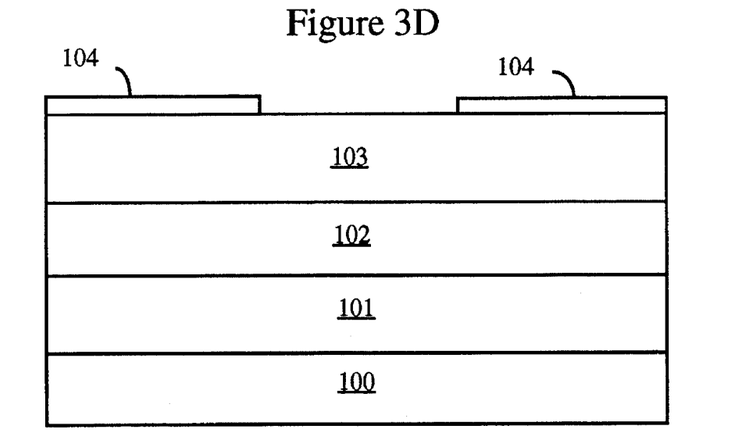
Figure 3E:
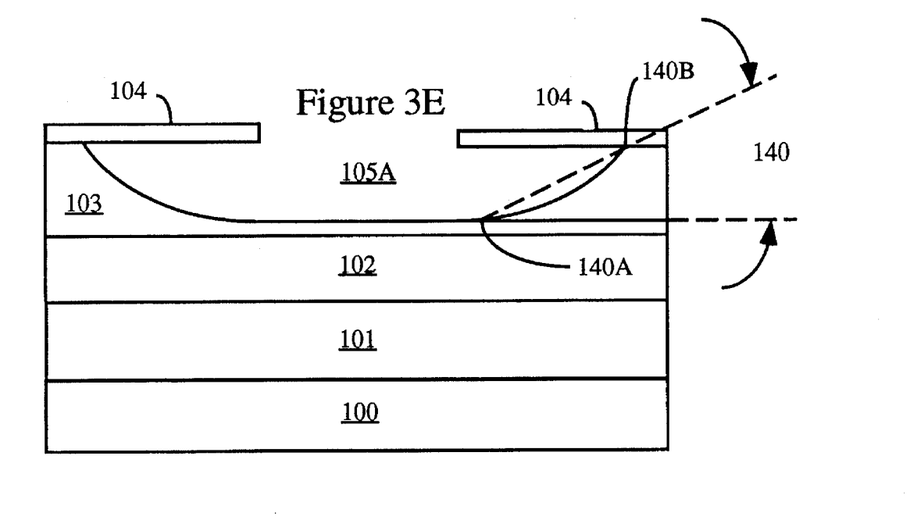

Then, a photoresist layer 104 is deposited and patterned as shown in FIG. 3D. A subsequent isotropic etch forms the opening 105A which is shown in FIG. 3E. Typically, this isotropic etch uses a conventional, diluted HF solution which etches down approximately 5500Å to 7500Å. In one embodiment of the present invention, the HF solution etches down 6500Å. In other embodiments, other etching processes, such as a plasma etch, are used to provide the angle 140, typically 40 degrees, which is measured from the beginning of the slope (point 140A) to the end of the slope (point 140B). This angle ensures good step coverage of the to-be-formed antifuse layer and the upper conductive layer in opening 105A.

Figure 3F:
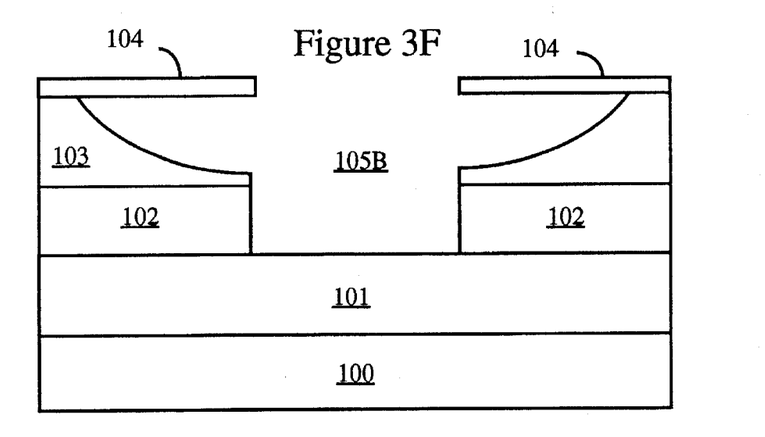

Referring to FIG. 3F, an anisotropic etch removes a portion of oxide layer 103 and oxide layer 102, thereby exposing lower conductive terminal 101. In this embodiment, the anisotropic etch is a plasma etch including a mixture of Freon-23 ($CHF_3$) and oxygen ($O_2$) at approximately 25° C. This anisotropic etch provides the via 105B.

Figure 3G:
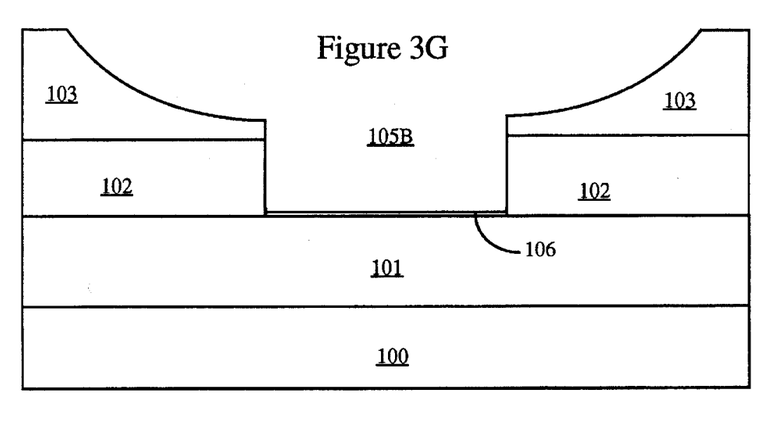

Subsequent to via definition, an oxygen plasma treatment is performed. During this oxygen plasma treatment, the temperature of the antifuse structure rises from approximately 25° C. to approximately 125° C. The combination of elevated temperature and reactive oxygen plasma produces an oxide layer 106 on lower conductive terminal 101 in via 105B as shown in FIG. 3G. Oxide layer 106 is typically an oxide of the material of lower conductive terminal 101. Thus, oxide layer 106 is either titanium oxide, tungsten oxide, or a mixture of titanium oxide and tungsten oxide. In this embodiment, oxide layer 106 is between 35Å and 70Å thick.

Figure 3H:
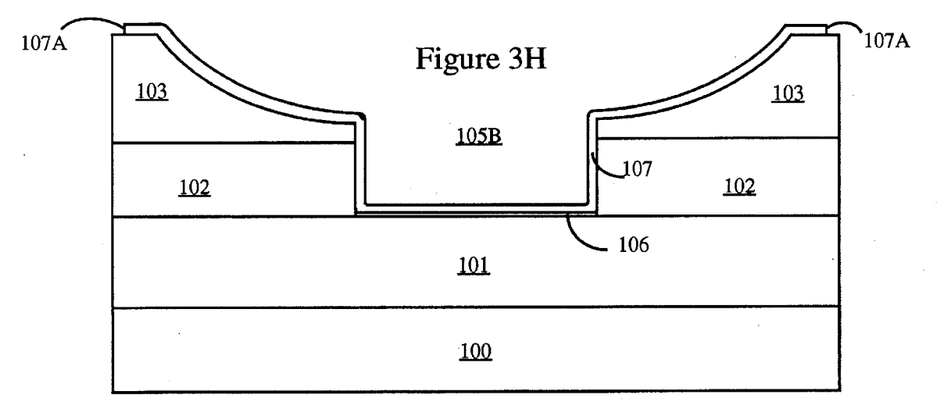

Then, referring to FIG. 3H, an amorphous silicon layer 107 is deposited in via 105B as well as areas adjacent to via 105B. Amorphous silicon layer 107 is typically deposited to a thickness of between 350Å and 550Å to ensure that this deposition follows the contour of via 105B. In one embodiment of the present invention, amorphous silicon layer 107 is 450Å thick and is formed by using pure silane gas ($SiH_4$) at a temperature of 300° C. and a pressure of 250 mTorr. In another embodiment, a mixture of silane gas and nitrogen ($N_2$) at a temperature of 300° C. is used to produce amorphous silicon layer 107. In that embodiment, amorphous silicon layer 107 has a typical nitrogen content (measured by number of atoms) of between 10% to 20%.

Figure 3I:
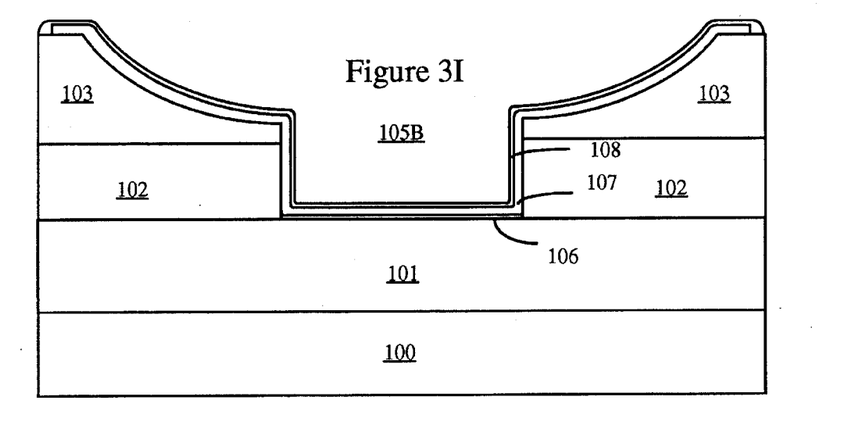

To improve the amorphous nature of amorphous silicon layer 107, i.e. break up any small crystals and reduce leakage, an argon implant, not shown, is performed at a dosage of $1 \times 10^{16}$ atoms/cc and an energy of 30 keV. Other implant dopants such as silicon, oxygen, or arsenic are alternatively used in other embodiments. Then, a photoresist layer (not shown) is deposited and patterned to define the edge 107A of the antifuse. An anisotropic etch etches the exposed portions of amorphous silicon layer 107, thereby providing the edges 107A shown in FIG. 3H. Subsequent to this anisotropic etch, another oxygen plasma treatment is performed, thereby forming a silicon dioxide layer 108 approximately 10–30Å thick which covers amorphous silicon layer 107 as shown in FIG. 3I. Finally, an upper conductive terminal 131 is formed using conventional methods.

Figure 3J:
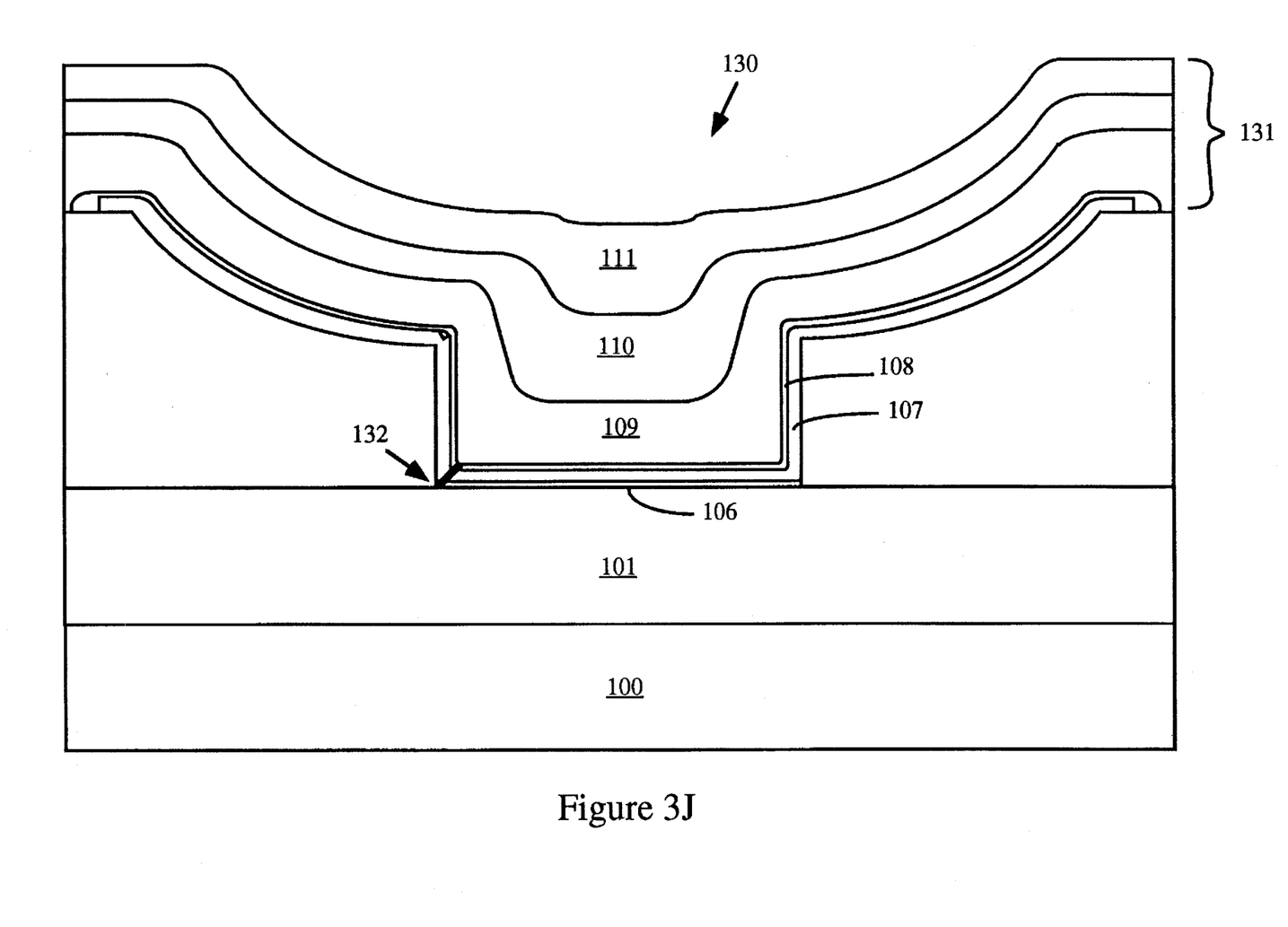
Figure 4:
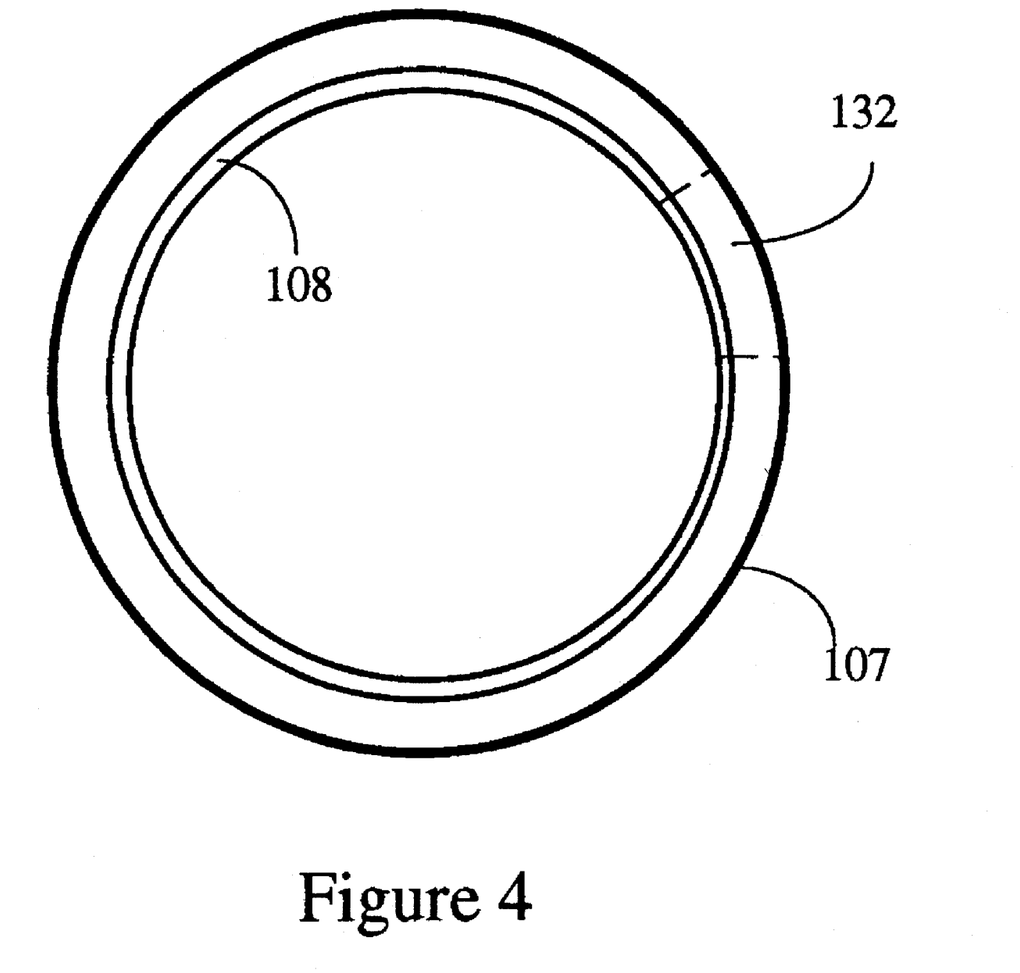
FIG. 4 shows a partial view of the antifuse illustrated in FIG. 3J after programming.

In one embodiment shown in FIG. 3J, upper conductive terminal 131 includes a titanium layer 109, a titanium-tungsten layer 110, and an aluminum-silicon-copper alloy layer 111. In other embodiments, upper conductive terminal 131 is formed from consecutive layers of titanium, titanium-nitride, titanium-tungsten, or consecutive layers of aluminum (formed on amorphous silicon layer 107), aluminum-silicon, and aluminum-silicon-copper.

In the embodiment of the present invention shown in FIG. 3H, antifuse 130 typically needs a programming voltage between 7.5 and 10 volts to form a conductive filament 132 which connects upper conductive terminal 131 and lower conductive terminal 101. Because standard transistors can withstand this low antifuse programming voltage, transistors in the antifuse structure can be small, density is high, and no special transistor processing steps are needed.

Moreover, a prior art antifuse having a typical length of 1500Å provides an undesirably high resistance value on the order of 150Ω. In contrast, the short length, i.e. approximately 350Å to 550Å, of conductive filament 132 provides a significantly lower resistance value of approximately 50Ω.

Furthermore, a prior art antifuses exhibits an unstable resistance value at stress current close to the programming current. A more detailed explanation of this phenomena is described in an article entited, "Antifuse Structure Comparison for Field Programmable Gate Arrays" by S. Chiang et al., IEEE IDEM, pages 611–614, 1992, which is herein incorporated by reference in its entirety. In contrast, an antifuse in accordance with the present invention provides a stable resistance value both under low current stress and under DC current stress close to the programming current over a time period of more than 1,000 hours.

As described above, the present invention provides that a portion of the composite antifuse layer, i.e. oxide layer 106, amorphous silicon layer 107 and oxide layer 108, forms a substantially orthogonal angle with the lower conductive terminal 101 and the upper conductive terminal 131. This "double corner" formation of the composite antifuse layer enhances the electric field at this location during programming, thereby ensuring a predictable location, and therefore resistance, of filament 132.

Furthermore, the present invention provides advantages under shearing conditions due to stress relaxation in the programmed antifuse. Specifically, stress relaxation typically occurs within a structure, not at its boundaries. Therefore, referring back to FIG. 2B, if shearing occurs in prior art antifuse 20, the sheared portion 19' of filament 19 significantly reduces the surface area 19A for conducting current, thereby resulting in instability of the resistance provided by antifuse 20. In contrast, filament 132 of the present invention which is formed at one of the boundaries of antifuse 130 is substantially unaffected by shearing conditions caused by stress relaxation. Therefore, an antifuse in accordance with the present invention provides a low, stable resistance even under the above-described adverse conditions.

Therefore, the antifuse of the present invention provides the following advantages: a predictable location of the antifuse filament, minimal shearing effects on the filament, a relatively low programming voltage, and a low, stable resistance value.

The above description of the present invention is meant to be illustrative only and not limiting. Other embodiments will be apparent to those skilled in the art in light of the detailed description. The present invention is set forth in the appended claims.

We claim:

1. A method of forming an antifuse comprising the steps of:

(a) forming a first conductive layer on a substrate;

(b) forming a first oxide layer on said first conductive layer;

(c) forming a via in said first oxide layer which extends to said first conductive layer, wherein said via includes a lower portion forming a profile perpendicular to said first conductive layer, and an upper portion forming a concave profile;

(d) forming an antifuse layer on said first conductive layer, wherein the top surface of said antifuse layer follows the contours of said lower and upper portions of said via; and (e) forming a second conductive layer on said antifuse layer.

2. The method of claim 1 wherein said antifuse layer forms a substantially orthogonal angle with each of said first conductive layer and said second conductive layer.

3. The method of claim 1 wherein step (d) includes forming an amorphous silicon layer.

4. The method of claim 3 wherein said amorphous silicon layer is formed to a thickness between 350Å and 550Å.

5. The method of claim 3 wherein said amorphous silicon layer is formed to a thickness of approximately 450Å.

6. The method of claim 3 wherein step (d) includes forming a second oxide layer on the bottom of said via between said first conductive layer and said amorphous silicon layer.

7. The method of claim 6 wherein said second oxide layer is formed from said first conductive layer.

8. The method of claim 6 wherein said second oxide layer is formed to a thickness between 35Å and 70Å.

9. The method of claim 7 wherein said second oxide layer includes titanium oxide.

10. The method of claim 7 wherein said second oxide layer includes tungsten oxide.

11. The method of claim 7 wherein said second oxide layer includes a combination of titanium oxide and tungsten oxide.

12. The method of claim 6 wherein step (d) includes forming a third oxide layer between said amorphous silicon layer and said second conductive layer.

13. The method of claim 12 wherein said third oxide layer includes a silicon dioxide layer.

14. The method of claim 12 wherein said third oxide layer is formed to a thickness between 10Å and 30Å.

15. The method of claim 12 wherein said third oxide layer completely insulates said amorphous silicon layer from said second conductive layer.

16. The method of claim 1 wherein said first conductive layer forms a lower conductive terminal of said antifuse.

17. The method of claim 1 wherein said first conductive layer includes a conductive metal.

18. The method of claim 17 wherein said conductive metal includes aluminum.

19. The method of claim 17 wherein said conductive metal includes an aluminum-silicon alloy.

20. The method of claim 17 wherein said conductive metal includes an aluminum-silicon-copper alloy.

21. The method of claim 17 wherein said conductive metal includes titanium.

22. The method of claim 17 wherein said conductive metal includes titanium nitride.

23. The method of claim 17 wherein said conductive metal includes titanium tungsten.

24. The method of claim 1 wherein said second conductive layer forms an upper conductive terminal of said antifuse.

* * * * *